(12) United States Patent
Hsiao et al.

(10) Patent No.: US 12,266,592 B2
(45) Date of Patent: *Apr. 1, 2025

(54) THROUGH VIAS OF SEMICONDUCTOR STRUCTURE AND METHOD OF FORMING THEREOF

(71) Applicant: Taiwan Semiconductor Manufacturing Co., Ltd., Hsinchu (TW)

(72) Inventors: Yuan-Yang Hsiao, Taipei (TW); Dian-Hau Chen, Hsinchu (TW); Yen-Ming Chen, Chu-Pei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/324,643

(22) Filed: May 26, 2023

(65) Prior Publication Data

US 2023/0298972 A1    Sep. 21, 2023

Related U.S. Application Data

(63) Continuation of application No. 17/363,519, filed on Jun. 30, 2021, now Pat. No. 11,705,384.

(60) Provisional application No. 63/168,385, filed on Mar. 31, 2021.

(51) Int. Cl.
*H01L 23/48* (2006.01)
*H01L 21/768* (2006.01)
*H01L 23/482* (2006.01)
*H01L 23/485* (2006.01)
*H01L 23/522* (2006.01)
*H01L 23/528* (2006.01)

(52) U.S. Cl.
CPC ...... *H01L 23/481* (2013.01); *H01L 21/76898* (2013.01); *H01L 23/5226* (2013.01)

(58) Field of Classification Search
CPC ............ H01L 23/481; H01L 21/76898; H01L 23/5226; H01L 23/5283; H01L 21/76877; H01L 21/76895; H01L 23/4824; H01L 23/485

See application file for complete search history.

(56) References Cited

U.S. PATENT DOCUMENTS

| | | |
|---|---|---|
| 8,993,380 B2 | 3/2015 | Hou et al. |
| 9,281,254 B2 | 3/2016 | Yu et al. |
| 9,299,649 B2 | 3/2016 | Chiu et al. |
| 9,372,206 B2 | 6/2016 | Wu et al. |
| 9,425,126 B2 | 8/2016 | Kuo et al. |
| 9,443,783 B2 | 9/2016 | Lin et al. |
| 9,461,018 B1 | 10/2016 | Tsai et al. |
| 9,496,189 B2 | 11/2016 | Yu et al. |

(Continued)

*Primary Examiner* — Herve-Louis Y Assouman
(74) *Attorney, Agent, or Firm* — Slater Matsil, LLP

(57) ABSTRACT

A semiconductor structure includes a semiconductor substrate and an interconnect structure on the semiconductor structure. The interconnect structure includes a first layer, a second layer over the first layer, a third layer over the second layer, and a fourth layer over the third layer. A first through via extends through the semiconductor substrate, the first layer, and the second layer. A second through via extends through the third layer and the fourth layer. A bottom surface of the second through via contacts a top surface of the first through via.

20 Claims, 14 Drawing Sheets

(56) References Cited

U.S. PATENT DOCUMENTS

| | | |
|---|---|---|
| 9,666,502 B2 | 5/2017 | Chen et al. |
| 9,735,131 B2 | 8/2017 | Su et al. |
| 11,705,384 B2 * | 7/2023 | Hsiao ................ H01L 21/76898 257/774 |
| 2010/0225002 A1 * | 9/2010 | Law ...................... H01L 23/481 257/E21.597 |
| 2014/0312491 A1 * | 10/2014 | Jin ...................... H01L 23/5225 257/737 |
| 2015/0137388 A1 | 5/2015 | Kim et al. |
| 2018/0211995 A1 | 7/2018 | Bak et al. |

* cited by examiner

THROUGH VIAS OF SEMICONDUCTOR STRUCTURE AND METHOD OF FORMING THEREOF

PRIORITY CLAIM AND CROSS-REFERENCE

This application is a continuation of U.S. patent application Ser. No. 17/363,519, filed on Jun. 30, 2021, which claims the benefit of U.S. Provisional Application No. 63/168,385, filed on Mar. 31, 2021, each application is hereby incorporated herein by reference.

BACKGROUND

The semiconductor industry has experienced rapid growth due to ongoing improvements in the integration density of a variety of electronic components (e.g., transistors, diodes, resistors, capacitors, etc.). For the most part, improvement in integration density has resulted from iterative reduction of minimum feature size, which allows more components to be integrated into a given area. As the demand for shrinking electronic devices has grown, a need for smaller and more creative fabrication techniques of semiconductor dies has emerged.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
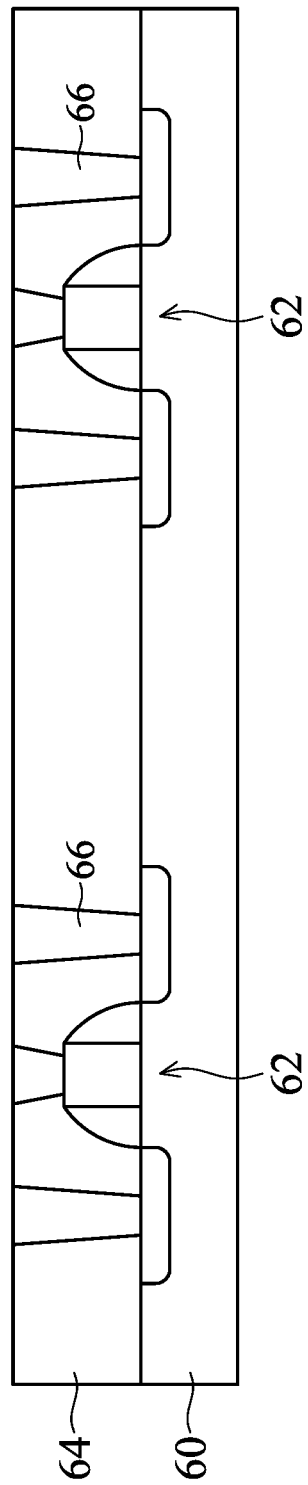
FIGS. 1 through 3B and 4 through 9 are cross-sectional views of intermediate steps during a process of forming a semiconductor structure, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments, a semiconductor die or wafer is formed, and multiple through vias are formed through the die or wafer, each of the through vias comprising multiple, vertically-aligned through vias. The through vias can be used to allow for stacking of multiple dies to form 3D packages or 3D integrated circuits (3DICs). By using multiple, vertically-aligned through vias, the aspect ratio of each through via may be reduced. Due to this, through vias with smaller widths may be used, which provides more space for structures such as active and passive devices and conductive lines and vias in interconnect and redistribution layers.

FIG. 1 is a cross-sectional view of a semiconductor structure 50, in accordance with some embodiments. A semiconductor substrate 60 is provided. The semiconductor substrate 60 may be silicon, doped or undoped, or an active layer of a semiconductor-on-insulator (SOI) substrate. The semiconductor substrate 60 may include other semiconductor materials, such as germanium; a compound semiconductor including silicon carbide, gallium arsenic, gallium phosphide, gallium nitride, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multilayered or gradient substrates, may also be used.

Devices 62 are formed at the active surface of the semiconductor substrate 60. For illustration purposes, FIG. 1 illustrates a transistor, but the devices 62 may be other active devices or passive devices. For example, the electrical components may be transistors, diodes, capacitors, resistors, or the like, formed by any suitable formation method. The devices 62 may be interconnected to form, e.g., memory devices or logic devices on the semiconductor structure 50.

One or more inter-layer dielectric (ILD) layer(s) 64 are formed on the semiconductor substrate 60, and electrically conductive features, such as contact plugs 66, are formed physically and electrically coupled to the devices 62. The ILD layer(s) 64 may be formed of any suitable dielectric material, for example, an oxide such as silicon oxide, phosphosilicate glass (PSG), borosilicate glass (BSG), boron-doped phosphosilicate glass (BPSG), or the like; a nitride such as silicon nitride; or the like. The ILD layer(s) may be formed by any suitable method, such as CVD, physical vapor deposition (PVD), ALD, PEALD, PECVD, SACVD, FCVD, spin-on, and/or the like, or a combination thereof. The electrically conductive features in the ILD layer(s) may be formed through any suitable process, such as deposition, damascene (e.g., single damascene, dual damascene, etc.), the like, or combinations thereof.

Figure 2:
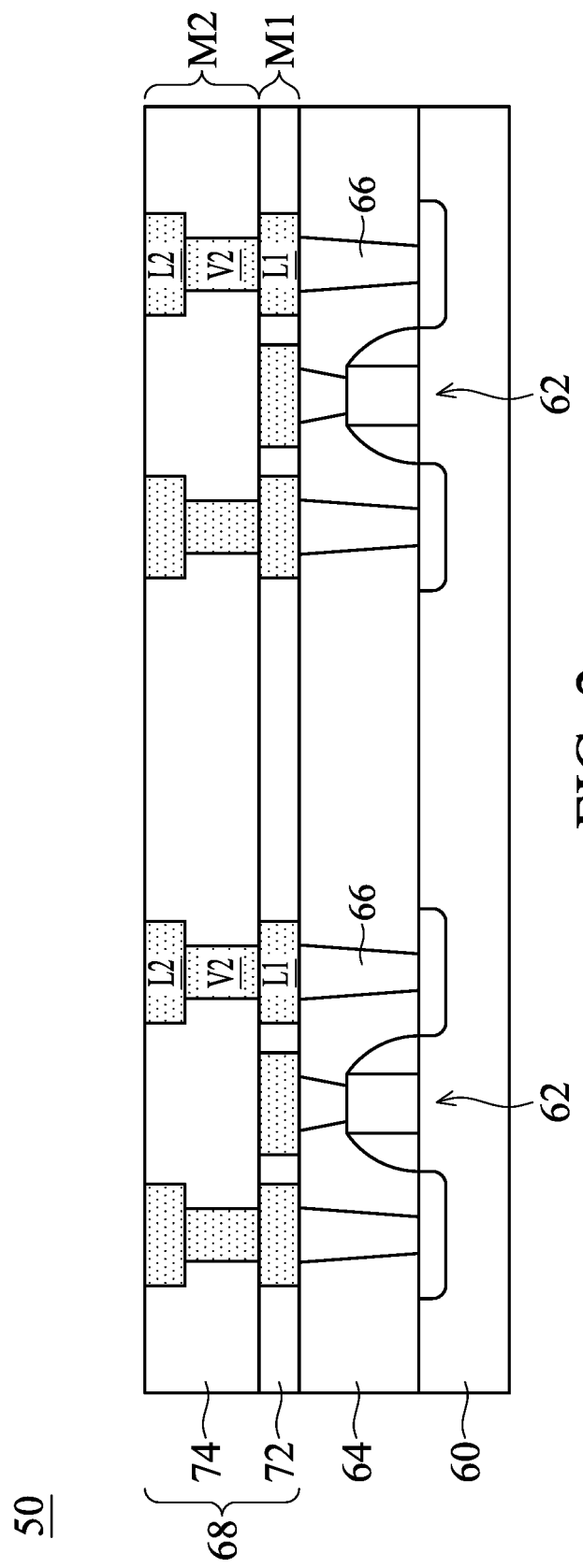

In FIG. 2, metallization layers M1 and M2 of an interconnect structure 68 (see below, FIG. 4) are formed over the semiconductor substrate 60, e.g., over the ILD layer(s) 64. The interconnect structure 68 interconnects the devices 62 to form integrated circuits. Metallization layers (e.g., metallization layers M1 and M2) comprise conductive vias and lines embedded in an intermetal dielectric (IMD) layer (e.g. IMD layers 72 and 74). In addition to providing insulation between various conductive elements, an IMD layer may include one or more dielectric etch stop layers (not individually shown) to control the etching processes that form openings in the IMD layer. Generally, vias conduct current vertically and are used to electrically connect two conductive features located at vertically adjacent levels, whereas lines conduct current laterally and are used to distribute electrical signals and power within one level.

Although two metallization layers are illustrated in FIG. 2, it should be appreciated that more or less metallization layers may be formed. Each of the metallization layers M1 and M2 includes metallization patterns in dielectric layers. The metallization patterns are electrically coupled to the devices 62 of the semiconductor substrate 60, and include, respectively, metal lines L1-L2 and vias V2 formed in one or more inter-metal dielectric (IMD) layers. The interconnect structure 68 may be formed by a damascene process, such as a single damascene process, a dual damascene process, or the like. In embodiments illustrated in accordance with FIG. 2, conductive lines L1 connect contact plugs 66 to conductive vias V2 and, at subsequent levels, vias connect lines on a level below the vias to lines above the vias (e.g., a pair of lines can be connected by a via). Some embodiments may adopt a different scheme. For example, conductive vias may be in the metallization layer M1 between the contact plugs 66 and the conductive lines L1. In some embodiments, the contact plugs 66 are formed through the ILD layer(s) 64 during the formation of the metallization layer M1.

Still referring to FIG. 2, the metallization layer M1 may be formed using, for example, a damascene process flow. First, a dielectric stack used to form IMD layer 72 may be deposited using one or more layers of the dielectric materials listed in the description of the ILD layer 64 (see above, FIG. 1). The techniques used to deposit the dielectric stack for the IMD layer 72 may be the same or similar as those used in forming the ILD layer 64.

Appropriate photolithography and etching techniques (e.g., anisotropic RIE employing fluorocarbon chemicals) may be used to pattern the IMD layer 72 to form openings for lines. Several conductive materials may be deposited to fill the trenches forming the conductive lines L1 of the metallization layer M1. For example, the openings may be first lined with one or more liners and then filled with a conductive fill layer. A conductive diffusion barrier liner may be formed over sidewalls and bottom surfaces of the trenches. Any excess conductive material over the IMD layer 72 outside of the openings may be removed by a planarizing process (e.g., CMP) thereby forming a top surface comprising dielectric regions of IMD layer 72 that are substantially coplanar with conductive regions of conductive lines L1. The planarization step completes fabrication of the metallization layer M1 comprising conductive lines L1 embedded in IMD layer 72, as illustrated in FIG. 2.

Still referring to FIG. 2, the metallization layer M2 may be formed on the metallization layer M1 using, for example, a dual damascene process flow. First, a dielectric stack used to form IMD layer 74 is formed using similar materials and methods as described above with respect to IMD layer 72. Next, openings for vias and lines are formed in the IMD layer 74 with appropriate photolithography and etching techniques. The openings for vias may be vertical holes extending through the IMD layer 74 to expose a top conductive surface of the conductive lines L1, and the openings for lines may be longitudinal trenches formed in an upper portion of the IMD layer 74. The openings may be formed using either a via-first process or a via-last process.

Several conductive materials may be deposited to fill the holes and trenches forming the conductive vias V2 and conductive lines L2 of the metallization layer M2. The conductive vias V2 and conductive lines L2 may be formed using similar materials and methods as described above for the conductive lines L1. Any excess conductive material over the IMD 74 outside of the openings may be removed by a planarizing process (e.g., CMP) thereby forming a top surface comprising dielectric regions of IMD 74 that are substantially coplanar with conductive regions of the metallization layer M2. The planarization step embeds the conductive vias V2 and conductive lines L2 into IMD 74, as illustrated in FIG. 2.

Although an example device 62 and example interconnect structures making connections to the electronic device are described, it is understood that one of ordinary skill in the art will appreciate that the above examples are provided for illustrative purposes only to further explain applications of the present embodiments, and are not meant to limit the present embodiments in any manner.

Figure 3A:
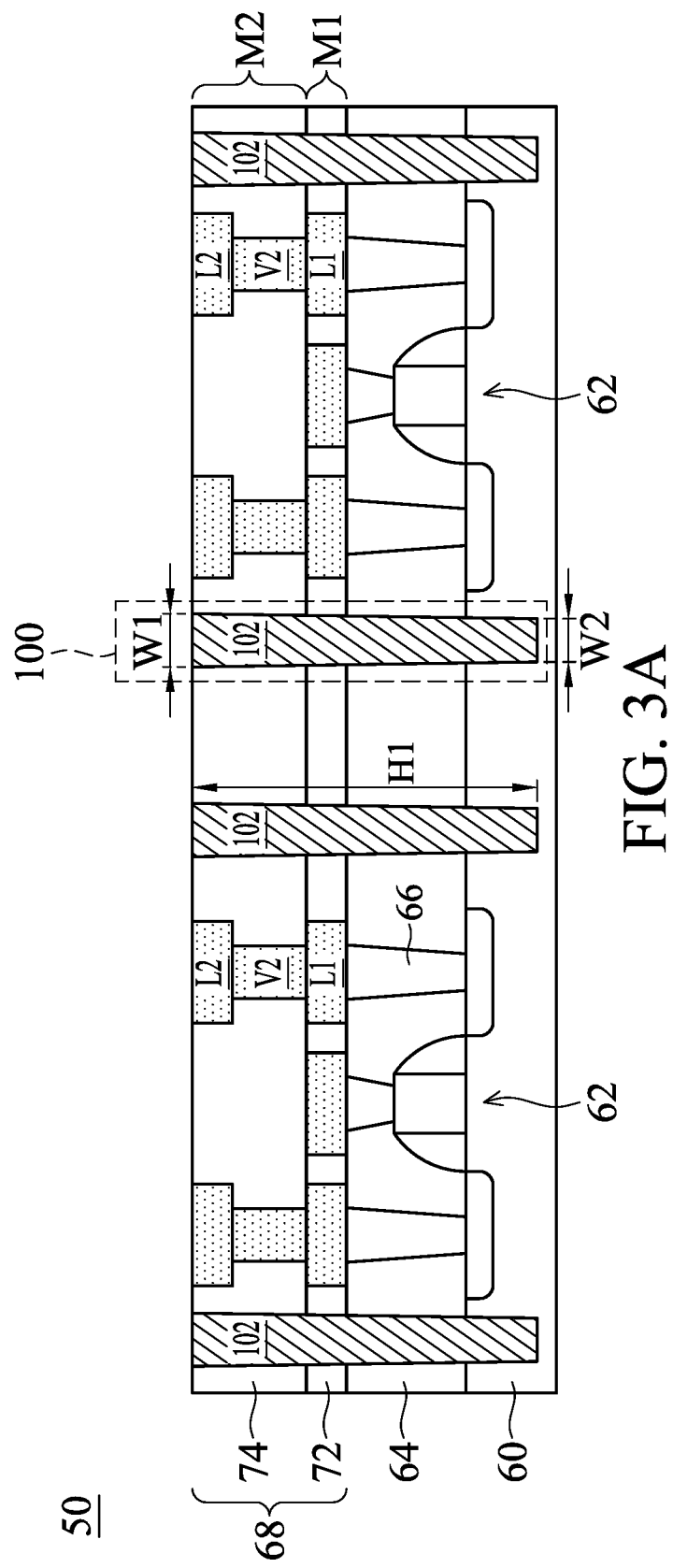
FIGS. 3C through 3F and 7B are top views of through vias, in accordance with some embodiments.
Figure 3B:
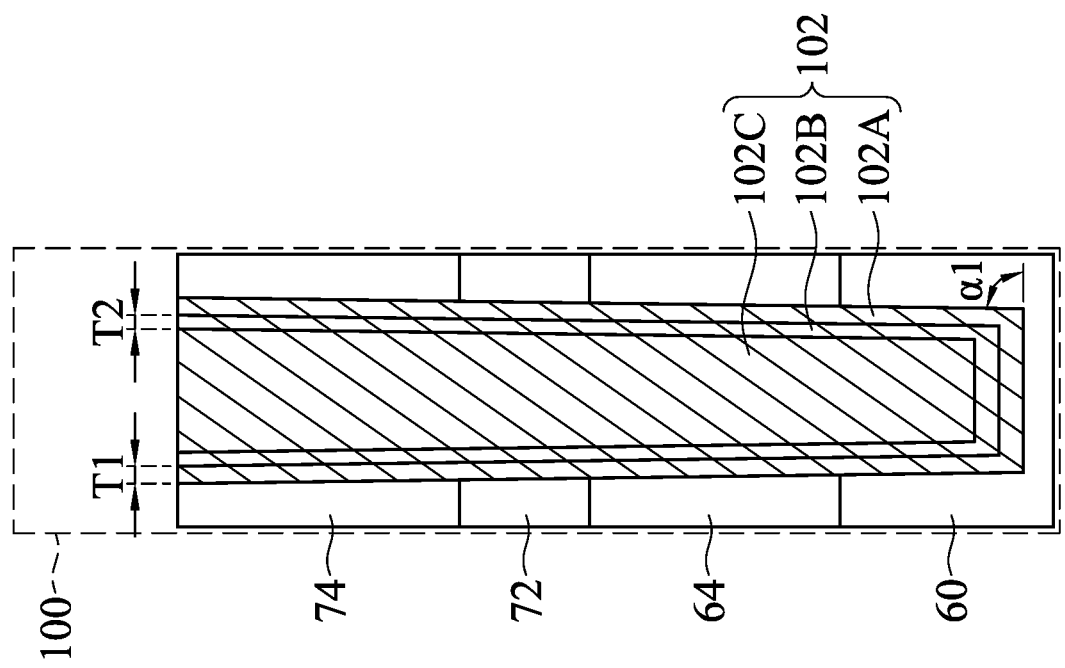

In FIGS. 3A and 3B, through vias 102 are formed through the metallization layers M2 and M1, the ILD layer 64, and are formed extending into the semiconductor substrate 60. FIG. 3B illustrates a detailed view of region 100 shown in FIG. 3A. The through vias 102 can be used for electrical connection of devices subsequently attached to the semiconductor structure 50. While the conductive lines L1 and L2 and the conductive vias V2 are formed within single metallization layers for interconnection of components within the semiconductor structure 50, the through vias 102 are formed through multiple metallization layers for the electrical connection of components formed outside the semiconductor structure 50. FIG. 3A illustrates through vias 102 extending through two metallization layers (e.g., metallization layers M1 and M2) for illustrative purposes. In some embodiments, the through vias 102 are formed after forming more or fewer metallization layer(s), e.g. formed after forming through metallization layers M4 through M1 or formed after forming metallization layer M1. The through vias 102 may be formed through any suitable number of metallization layers.

As an example to form the through vias 102, recesses can be formed through the metallization layers M2 and M1, the ILD layer 64, and into the semiconductor substrate 60. The recesses may be formed by applying, exposing, and developing a suitable photoresist (not shown) over the metallization layer M2 to define a desired pattern of through vias. One or more etching process may be used to remove portions of the metallization layers M1 and M2, the ILD 64, and the semiconductor substrate 60 that are exposed to the desired depth. Other techniques, such as milling, laser techniques, a combination thereof, and/or the like, may also be used. The recesses may be formed so as to extend into the semiconductor substrate 60 at least further than the devices 62 formed within and/or on the semiconductor substrate 60. In some embodiments the recesses extend to a depth greater than the eventual desired height of the semiconductor substrate 60.

Once the recesses have been formed within the semiconductor substrate 60, in some embodiments the recesses are lined with a liner 102A as illustrated in FIG. 3B. The liner 102A may be, e.g., an oxide formed from tetraethylorthosilicate (TEOS) or silicon nitride, although any suitable dielectric material may be used. The liner 102A may be formed using a plasma enhanced chemical vapor deposition (PECVD) process, although other suitable processes, such as physical vapor deposition or a thermal process, may alternatively be used. The liner 102A may have a thickness T1 in a range of 5 nm to 500 nm.

Once the liner 102A has been formed along the sidewalls and bottom of the recesses, a barrier layer 102B may be conformally deposited in the recesses, such as by CVD, atomic layer deposition (ALD), physical vapor deposition (PVD), thermal oxidation, the like, or a combination thereof. The barrier layer 102B may be formed from an oxide, a nitride, or an oxynitride, such as titanium nitride, titanium oxynitride, tantalum nitride, tantalum oxynitride, tungsten nitride, a combination thereof, and/or the like. However, any suitable material for the barrier layer 102B may be used. In some embodiments, the barrier layer 102B is formed directly along the sidewalls and bottom of the recesses. The barrier layer 102B may have a thickness T2 in a range of 5 nm to 500 nm.

After forming the barrier layer 102B, the remainder of the recesses may be filled with a first conductive material 102C. The first conductive material 102C may comprise copper, tungsten, cobalt, aluminum, silver, gold, alloys, doped polysilicon, the like, or a combination thereof. The first conductive material 102C may be formed by deposition or electroplating copper onto a seed layer (not shown), filling and overfilling the recesses. However, any suitable process such as CVD, PVD, or the like may be used. Once the recesses have been filled, excess liner 102A, barrier layer 102B, seed layer, and first conductive material 102C outside of the recesses may be removed through a planarization process such as chemical mechanical polishing (CMP), although any suitable removal process may be used. Excess portions of the first conductive material 102C, the barrier layer 102B, and the liner 102A are removed from the surface of the metallization layer M2 by, for example, a chemical-mechanical polish (CMP). Remaining portions of the liner 102A, the barrier layer 102B, and the first conductive material 102C form the through vias 102. In some embodiments, the liner 102A is a single continuous material extending from a bottom surface of the through via 102 to a top surface of the through via 102, and the barrier layer 102B is a single continuous material covering a sidewall of the liner 102A to the top surface of the through via 102.

In some embodiments as illustrated in accordance with FIG. 3A, the through vias 102 are not yet exposed at the back side of the semiconductor substrate 60. Rather, the through vias 102 are buried in the semiconductor substrate 60. As will be discussed in greater detail below, the through vias 102 will be exposed at the back side of the semiconductor substrate 60 in subsequent processing. In other embodiments, the through vias 102 are formed through the semiconductor substrate 60. The through vias 102 may be formed to a height H1 in a range of 2 μm to 15 μm. Sidewalls of the through vias 102 may be tapered.

The through vias 102 may be formed to a width W1 at an upper surface of the through vias 102 in a range of 0.2 μm to 3 μm, which may be advantageous by providing more space for structures such as active and passive devices in and on the semiconductor substrate 60 and conductive lines and vias in the metallization layers. Forming the through vias 102 to a width W1 less than 0.2 μm may be disadvantageous due to having a high aspect ratio, leading to poor filling and worse device performance. Forming the through vias 102 to a width W1 more than 3 μm may be disadvantageous due to reducing available space for active devices, passive devices, conductive lines, and conductive vias. The through vias 102 may be formed to a width W2 at a lower surface of the through vias 102 in a range of 0.1 μm to 2.5 μm. The through vias 102 may have a taper angle α1 in a range of 60° to 89°.

Figure 3D:
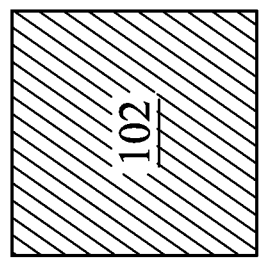
Figure 3F:
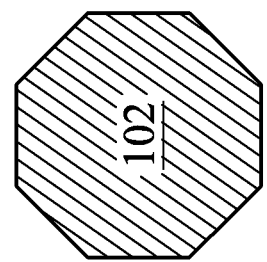
Figure 3C:
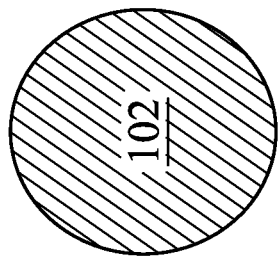
Figure 3E:
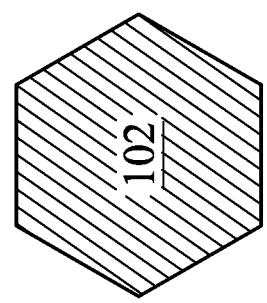

FIGS. 3C through 3F illustrate various top views of the through vias 102, in accordance with some embodiments. FIG. 3C illustrates a through via 102 having a round shape in a top view, FIG. 3D illustrates a through via 102 having a square shape in a top view, FIG. 3E illustrates a through via 102 having a hexagonal shape in a top view, and FIG. 3F illustrates a through via 102 having an octagonal shape in a top view. However, any suitable shape may be used for the through vias 102.

Figure 4:
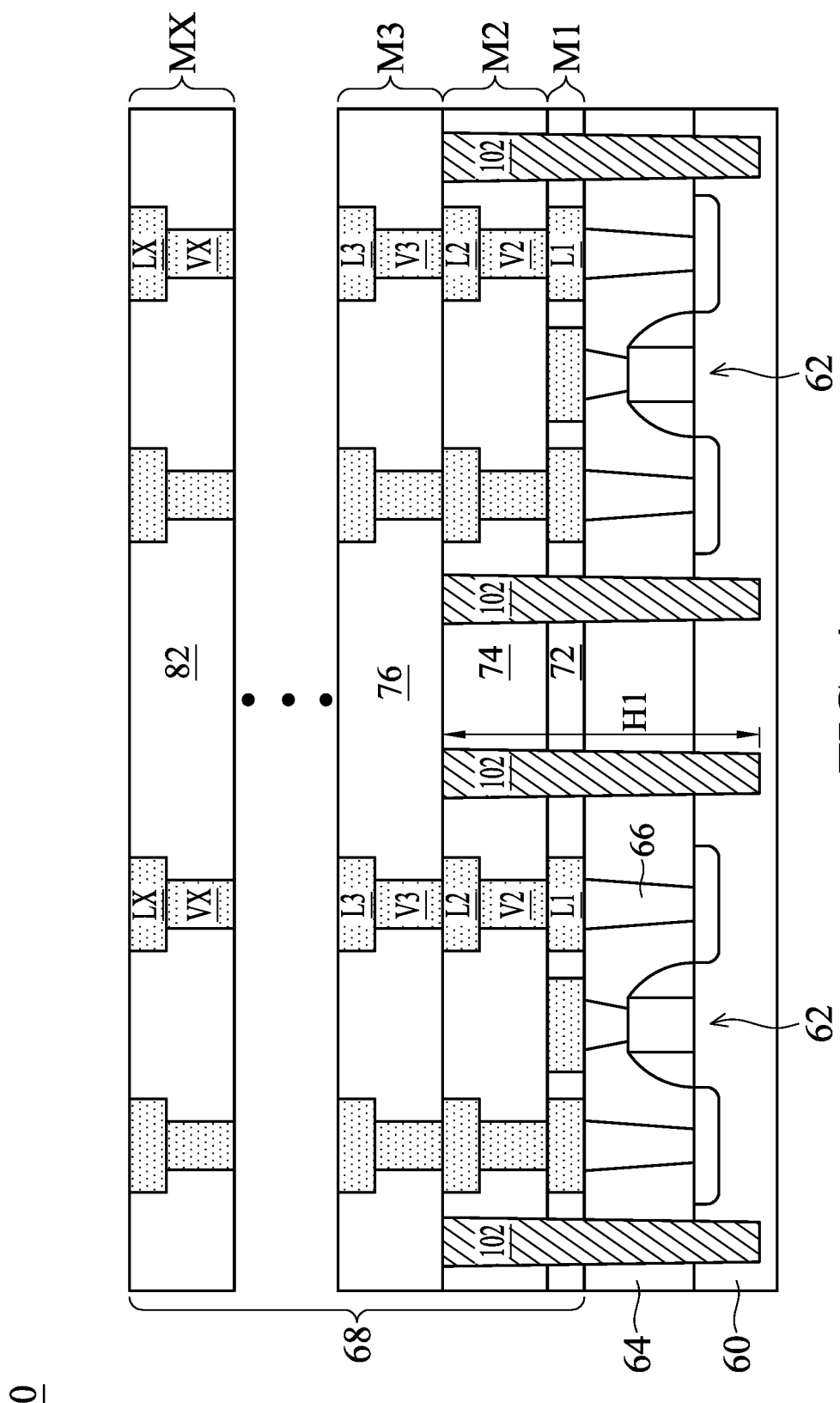

In FIG. 4, additional metallization layers M3 through MX are formed over the metallization layer M2 to form the interconnect structure 68. Metallization layer MX represents an Xth metallization layer, with metallization layers between M3 and MX represented by ellipsis for simplicity of illustration. Any suitable number of metallization layers may be formed in the interconnect structure 68, such as four to twenty metallization layers. The metallization layer M3, comprises IMD layer 76, conductive vias V3, and conductive lines L3, respectively, and the metallization layer MX comprises IMD layer 82, conductive vias VX, and conductive lines LX. The materials and processing techniques described above in the context of the metallization layer M2 with respect to FIG. 2 may be used to form the metallization layers M3 through MX.

Figure 5A:
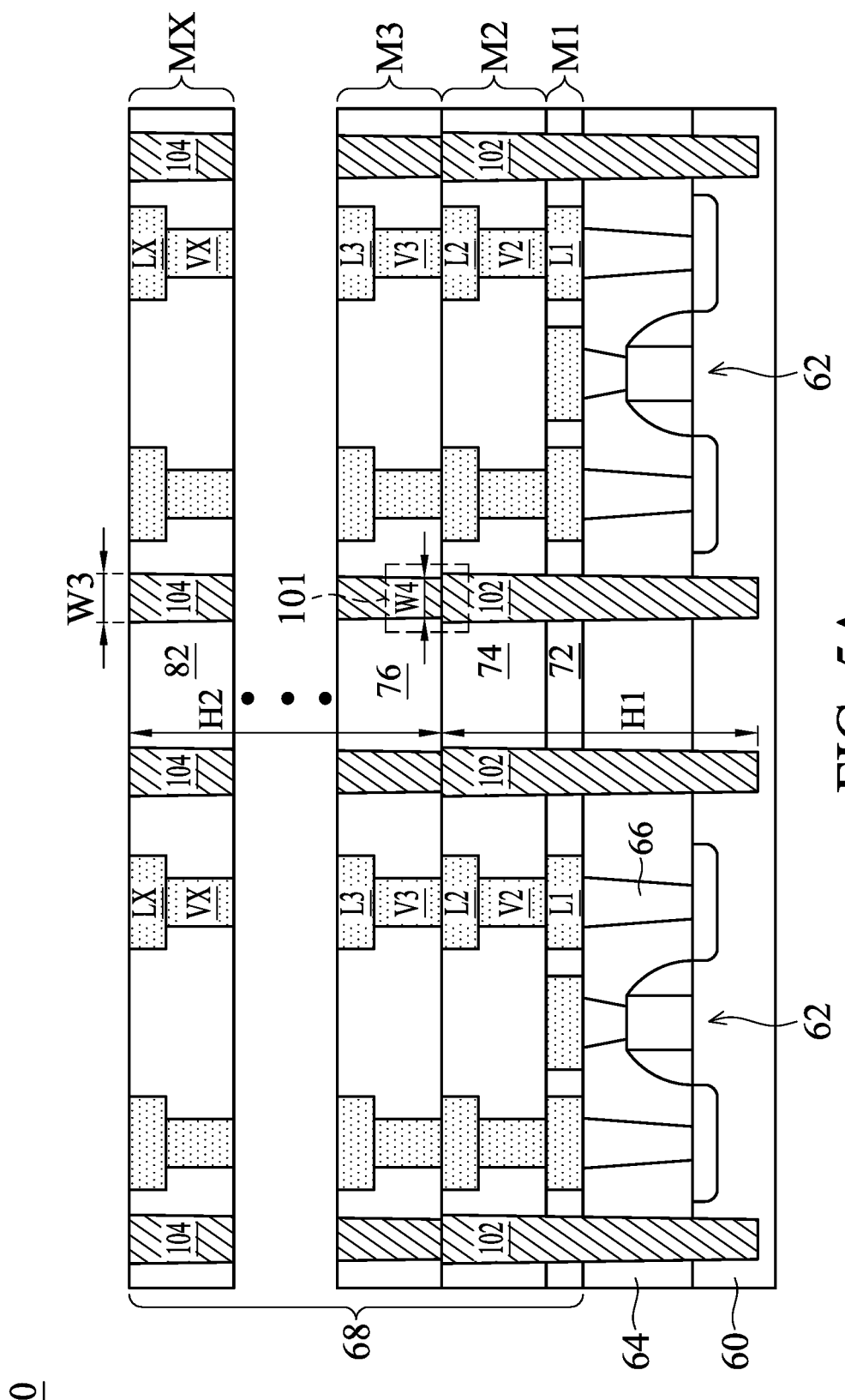
Figure 5B:
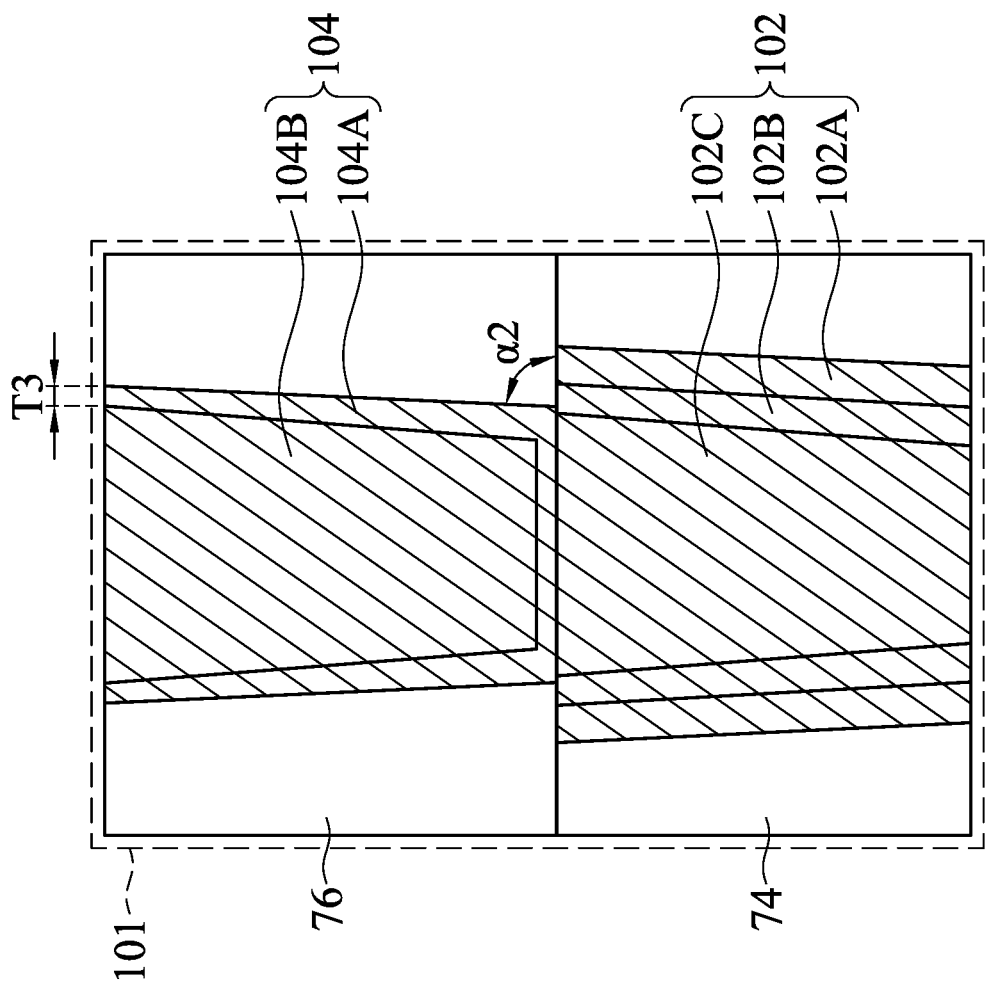

In FIG. 5A, through vias 104 are formed through the metallization layers MX through M3 to make electrical contact with the through vias 102. FIG. 5B illustrates a detailed view of region 101 as shown in FIG. 5A, in accordance with some embodiments. The through vias 104 can be used with the through vias 102 for electrical connection of devices subsequently attached to the semiconductor structure 50. Recesses for the through vias 104 may be formed using processing techniques described above in the context of the through vias 102 with respect to FIG. 3A. Once the recesses have been formed through the metallization layers MX through M3, one or more barrier layers, represented in the Figures as a barrier layer 104A, may be formed in the recesses. In some embodiments as illustrated in accordance with FIG. 5B, the barrier layer 104A is deposited over the sidewalls and bottom surfaces of the recesses by ALD, CVD, or another suitable deposition technique. The barrier layer 104A may be or comprise titanium nitride, tantalum nitride, the like, or a combination thereof. The barrier layer 104A may have a thickness T3 in a range of 5 nm to 500 nm.

After forming the barrier layer 104A, the remainder of the recesses may be filled with a second conductive material 104B. The second conductive material 104B may be formed using materials and processing techniques described above in the context of the first conductive material 102C with respect to FIG. 3B. Once the recesses have been filled, excess barrier layer 104A and second conductive material 104B outside of the recesses may be removed through a planarization process such as chemical mechanical polishing (CMP), although any suitable removal process may be used. Remaining portions of the barrier layer 104A and the second conductive material 104B form the through vias 104. In some embodiments, the barrier layer 104A is a single continuous material extending from a bottom surface of the through via 104 to a top surface of the through via 104.

The through vias 104 may be formed to a height H2 in a range of 2 μm to 15 μm. Although the through vias 104 are illustrated as being formed through the metallization layers MX through M3, the through vias 104 may be formed through any suitable number of metallization layers. For example, the through vias 104 could be formed through two metallization layers M4 and M3, through five metallization layers M7 through M3, or through ten metallization layers M12 through M3.

The through vias 104 may be formed to a width W3 at an upper surface of the through vias 104 in a range of 0.2 μm to 3 μm, which may be advantageous by providing more space for conductive lines and vias in the metallization layers. Forming the through vias 104 to a width W3 less than 0.2 µm may be disadvantageous due to having a high aspect ratio, leading to poor filling and worse device performance. Forming the through vias 104 to a width W3 more than 3 µm may be disadvantageous due to reducing available space for conductive lines and conductive vias. The through vias 104 may be formed to a width W4 at a lower surface of the through vias 104 in a range of 0.1 µm to 2.5 µm. The through vias 104 may have a taper angle α2 in a range of 60° to 89°.

Figure 6:
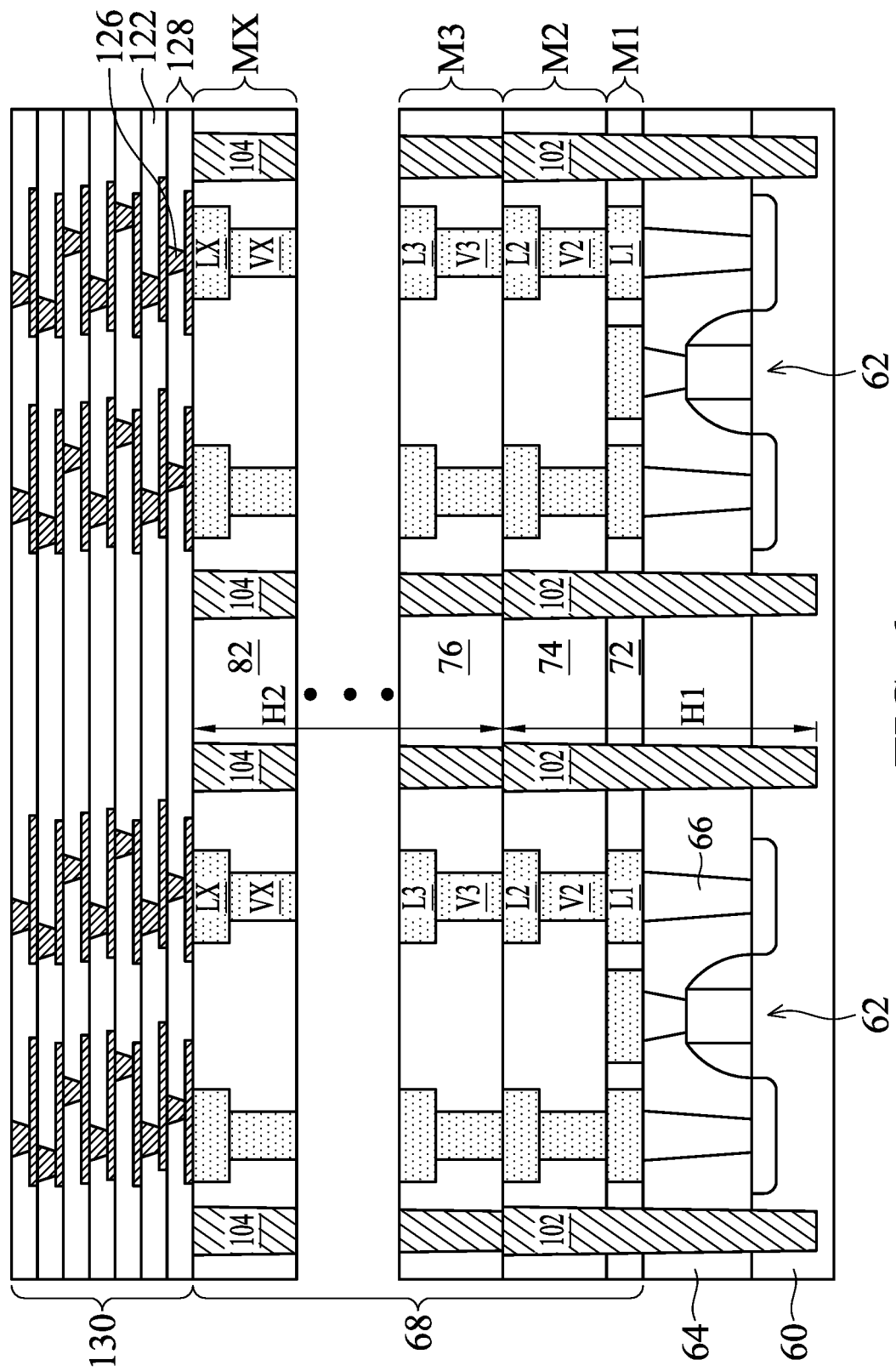

In FIG. 6, a redistribution structure 130 is formed on the interconnect structure 68. The redistribution structure 130 may include multiple redistribution layers 128. Each redistribution layer 128 comprises a respective insulating layer 122 and a respective metallization pattern 126 (sometimes referred to as redistribution lines) embedded in the respective insulating layer 122. Although seven redistribution layers 128 are illustrated in FIG. 6, it should be appreciated that more or less redistribution layers may be formed. The metallization patterns 126 of the redistribution structure 108 are connected to the conductive lines LX of the interconnect structure 68.

The metallization patterns 126 each include conductive vias and/or conductive lines. The conductive vias extend through the insulating layers 122, and the conductive lines extend along the insulating layers 122. As an example to form a metallization pattern 126, a seed layer (not illustrated) is formed over the respective underlying features. For example, the seed layer can be formed on the IMD layer 82, conductive lines LX, and through vias 104 when the bottommost level of the redistribution structure 130 is formed, or the seed layer can be formed on a respective insulating layer 122 and in the openings through the respective insulating layer 122 when the intermediate/topmost levels of the redistribution structure 130 are formed. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using a deposition process, such as PVD or the like. A photoresist is then formed and patterned on the seed layer. The photoresist may be formed by spin coating or the like and may be exposed to light for patterning. The pattern of the photoresist corresponds to the metallization pattern. The patterning forms openings through the photoresist to expose the seed layer. A conductive material is formed in the openings of the photoresist and on the exposed portions of the seed layer. The conductive material may be formed by plating, such as electroplating or electroless plating, or the like. The conductive material may comprise a metal or a metal alloy, such as copper, titanium, tungsten, aluminum, the like, or combinations thereof. Then, the photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching. The remaining portions of the seed layer and conductive material form the metallization pattern for one redistribution layer 128 of the redistribution structure 130.

In some embodiments, the insulating layers 122 are formed of a polymer, which may be a photo-sensitive material such as PBO, polyimide, a BCB-based polymer, or the like, may be patterned using a lithography mask. In other embodiments, the insulating layers 122 are formed of a nitride such as silicon nitride; an oxide such as silicon oxide, PSG, BSG, BPSG; or the like. The insulating layers 122 may be formed by spin coating, lamination, CVD, the like, or a combination thereof. After each insulating layer 122 is formed, it is then patterned to expose underlying conductive features, such as portions of the underlying metallization patterns 126. The patterning may be by an acceptable process, such as by exposing the dielectrics layers to light when the insulating layers 122 are a photo-sensitive material, or by etching using, for example, an anisotropic etch. If the insulating layers 122 are photo-sensitive materials, the insulating layers 122 can be developed after the exposure.

The redistribution structure 130 is illustrated as an example. More or fewer redistribution layers 128, each comprising respective insulating layers 122 and metallization patterns 126, than illustrated may be formed in the redistribution structure 130 by repeating or omitting the steps described above.

Figure 7A:
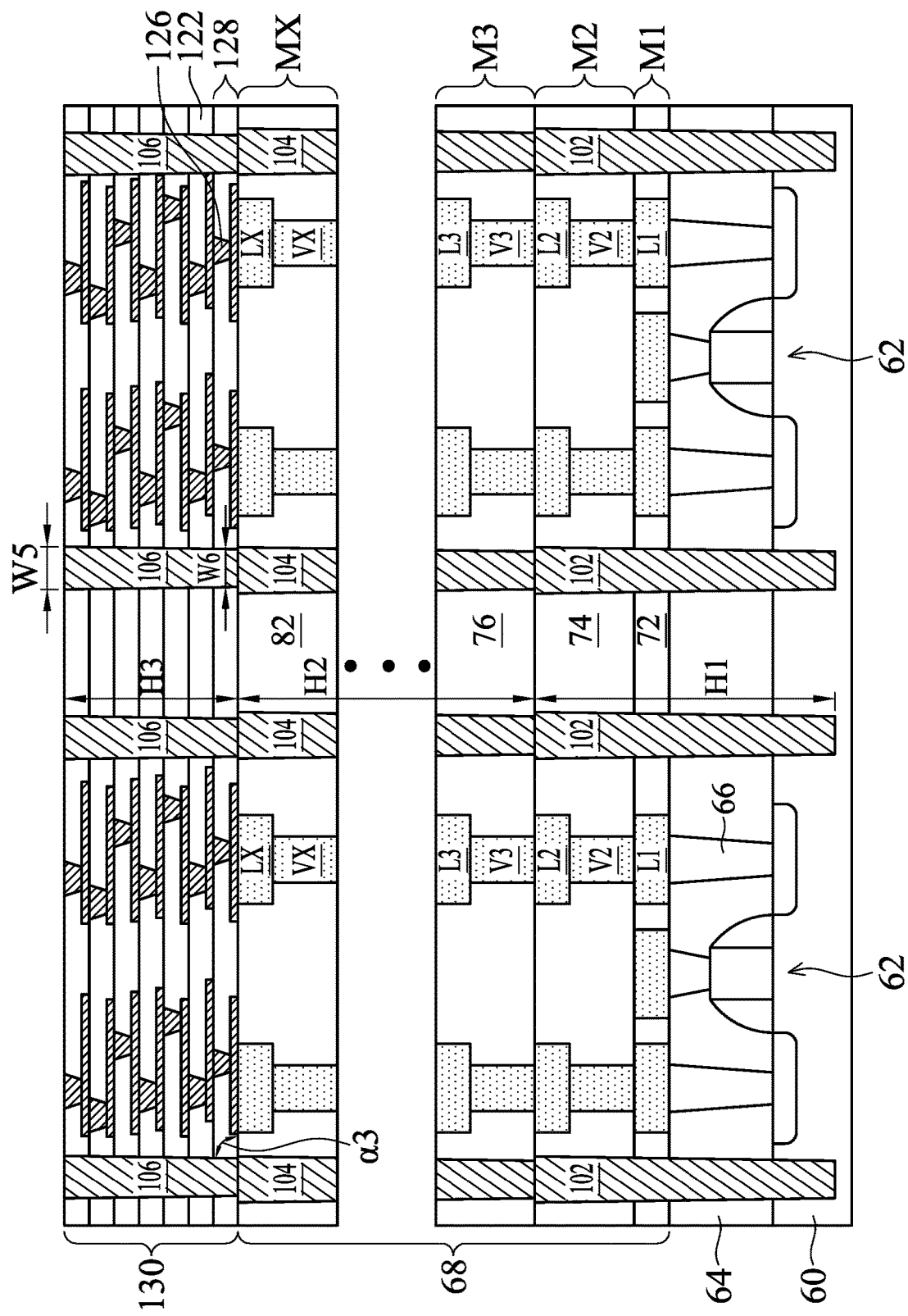

In FIG. 7A, through vias 106 are formed through the redistribution structure 130 to make electrical contact with the through vias 104. The through vias 106 can be used with the through vias 104 and 102 for electrical connection of devices subsequently attached to the semiconductor structure 50. The through vias 106 may be formed using materials and processing techniques described above in the context of the through vias 104 with respect to FIG. 5A. The through vias 106 may be formed to a height H3 in a range of 2 µm to 15 µm.

The through vias 106 may be formed to a width W5 at an upper surface of the through vias 106 in a range of 0.2 µm to 3 µm, which may be advantageous by providing more space for conductive lines and vias in the metallization layers. Forming the through vias 106 to a width W5 less than 0.2 µm may be disadvantageous due to having a high aspect ratio, leading to poor filling and worse device performance. Forming the through vias 106 to a width W5 more than 3 µm may be disadvantageous due to reducing available space for conductive lines and vias of the metallization patterns 126. The through vias 106 may be formed to a width W6 at a lower surface of the through vias 106 in a range of 0.1 µm to 2.5 µm. The through vias 106 may have a taper angle α3 in a range of 60° to 89°.

Figure 7B:
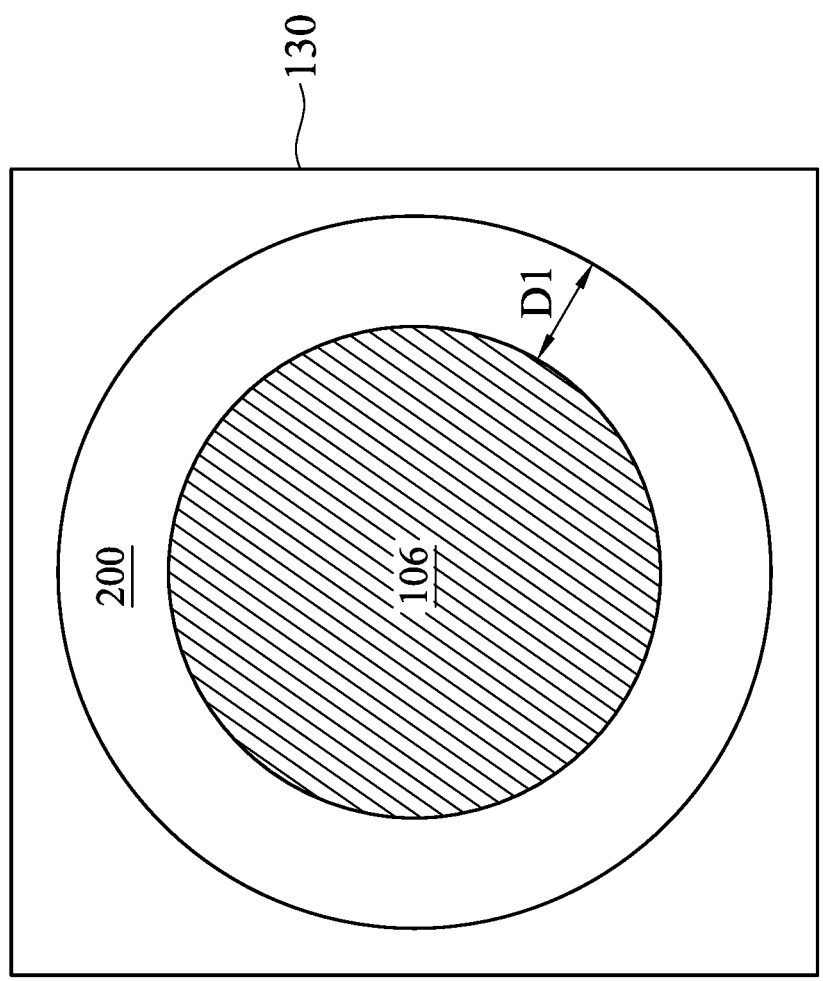

FIG. 7B illustrates a top view of a through via 106 and surrounding material of the top surface of the redistribution structure 130. In some embodiments, the through via 106 is surrounded by a keep-out zone 200 free of other conductive features extending to a distance D1 in a range of 0.2 µm to 5 µm from the outer sidewalls of the through via 106. In some embodiments, the keep-out zone 200 extends from the top surface of the redistribution structure 130 to the bottom surface of the semiconductor substrate 60 (see FIG. 7A) and further surrounds the through vias 102 and 104 that are vertically aligned with the through via 106, extending to a distance D1 from the respective outer sidewalls of the through vias 102 and 104. The keep-out zone 200 is free of other conductive features besides through vias 102, 104, 106, and/or any other through vias vertically aligned with the through via 106.

Figure 8:
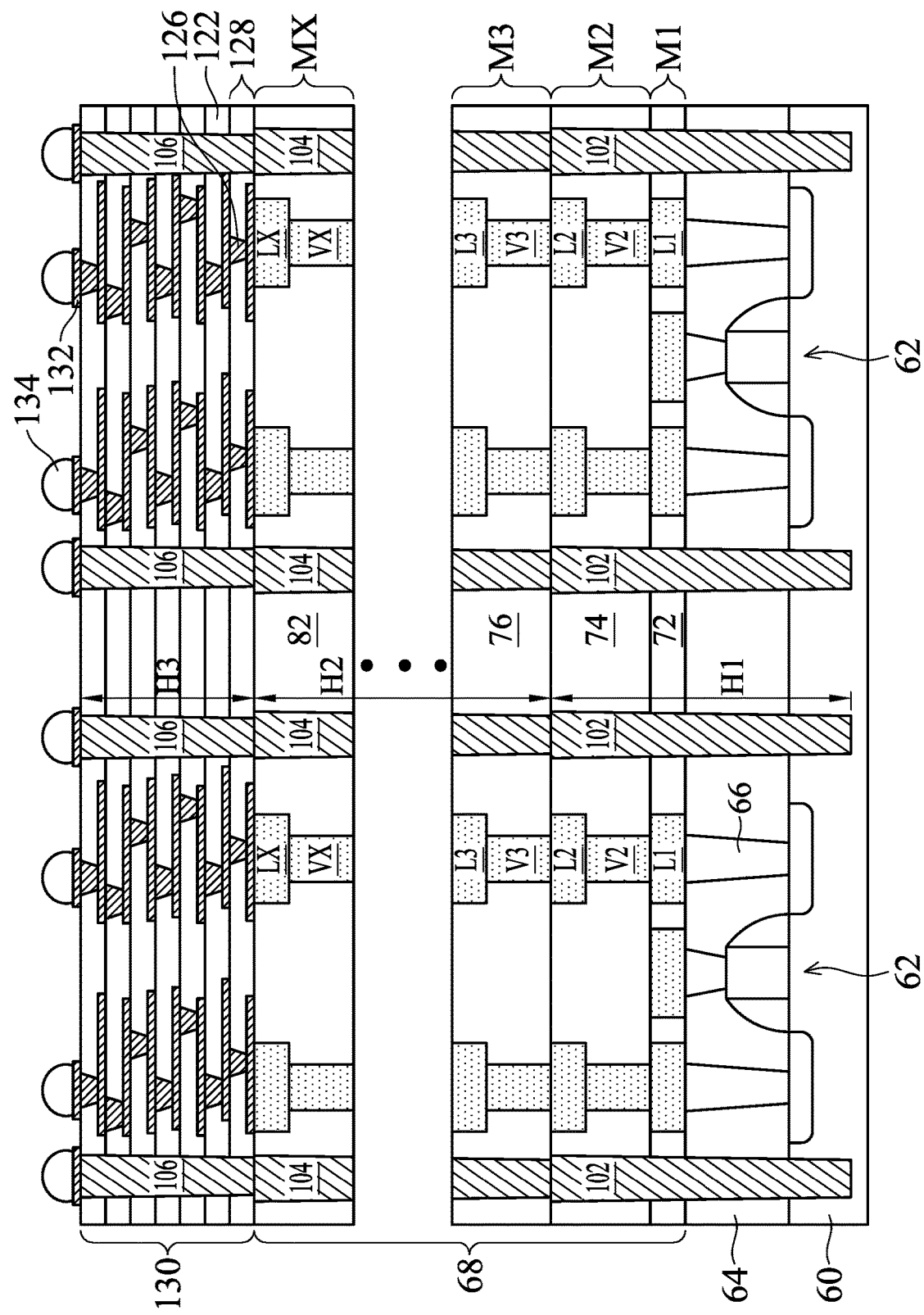

In FIG. 8, conductive connectors 134 are formed connected to the through vias 106 and the metallization patterns 126 of the redistribution structure 130. The conductive connectors 134 may be used to electrically connect the through vias 106 and the metallization patterns 126 to external devices. In some embodiments, under bump metallurgies (UBMs) 132 are formed on the top insulating layer 122 of the redistribution structure 130 and electrically coupled to the through vias 106 and metallization patterns 126. The UBMs 132 may be formed using similar materials and methods as described above for the metallization patterns 126 with respect to FIG. 6. In some embodiments, the UBMs 132 extend below a top surface of the redistribution structure 130. The conductive connectors 134 may be formed on the UBMs 132. In some embodiments, the UBMs 132 are not formed and the conductive connectors 134 are formed directly on top surfaces of the through vias 106 and the metallization patterns 126. The conductive connectors 134 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 134 may be formed of a metal or metal alloy, such as solder, copper, aluminum, gold, nickel, silver, palladium, tin, the like, or a combination thereof. In some embodiments, the conductive connectors 134 are formed by initially forming a layer of solder through such commonly used methods such as evaporation, electroplating, printing, solder transfer, ball placement, or the like. Once a layer of solder has been formed on the structure, a reflow may be performed in order to shape the material into the desired bump shapes. In another embodiment, the conductive connectors 134 are metal pillars (such as a copper pillar) formed by a sputtering, printing, electro plating, electroless plating, CVD, or the like. The metal pillars may be solder free and have substantially vertical sidewalls.

Figure 9:
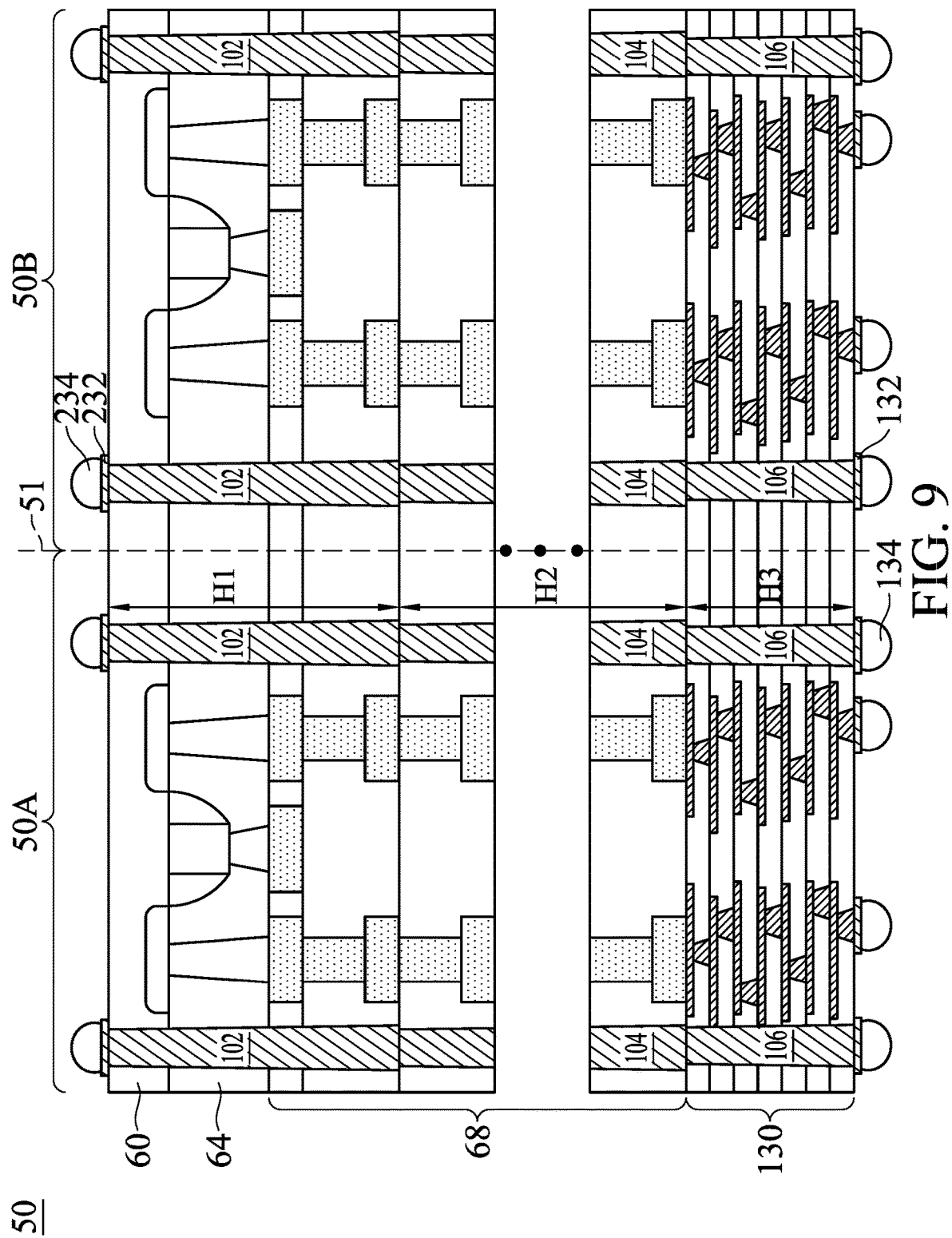

In FIG. 9, conductive connectors 234 are formed on the semiconductor substrate 60 for electrical connection of the through vias 102. The semiconductor structure 50 is flipped over and placed on a tape (not shown). In some embodiments, a planarization of the back side of the semiconductor substrate is performed to expose the through vias 102. The planarization process may be, for example, a grinding and/or a chemical-mechanical polish (CMP) to remove a portion of the semiconductor substrate 60 over the surfaces of the through vias 102. However, any suitable process may be used.

After the surfaces of the through vias 102 are exposed, conductive connectors 234 are formed on the semiconductor substrate 60 and electrically coupled to the through vias 102. In some embodiments, UBMs 232 are formed on the semiconductor substrate 60 and electrically coupled to the through vias 102 and metallization patterns 126. The UBMs 132 may be formed using similar materials and methods as described above for the metallization patterns 126 with respect to FIG. 6. The conductive connectors 234 may be formed on the UBMs 232 using similar materials and methods as described above for the conductive connectors 134 with respect to FIG. 8.

Next, a singulation process is performed by sawing along scribe line regions 51, e.g., between a device region 50A and adjacent device regions such as e.g. device region 50B. The sawing singulates the device region 50A from adjacent device regions such as e.g. device region 50B. The resulting, singulated semiconductor dies 150 (see below, FIG. 10) are from the device region 50A and the device region 50B, respectively. The singulation process includes sawing the semiconductor substrate 60, the ILD layer 64, the interconnect structure 68, and the redistribution structure 130.

Figure 10:
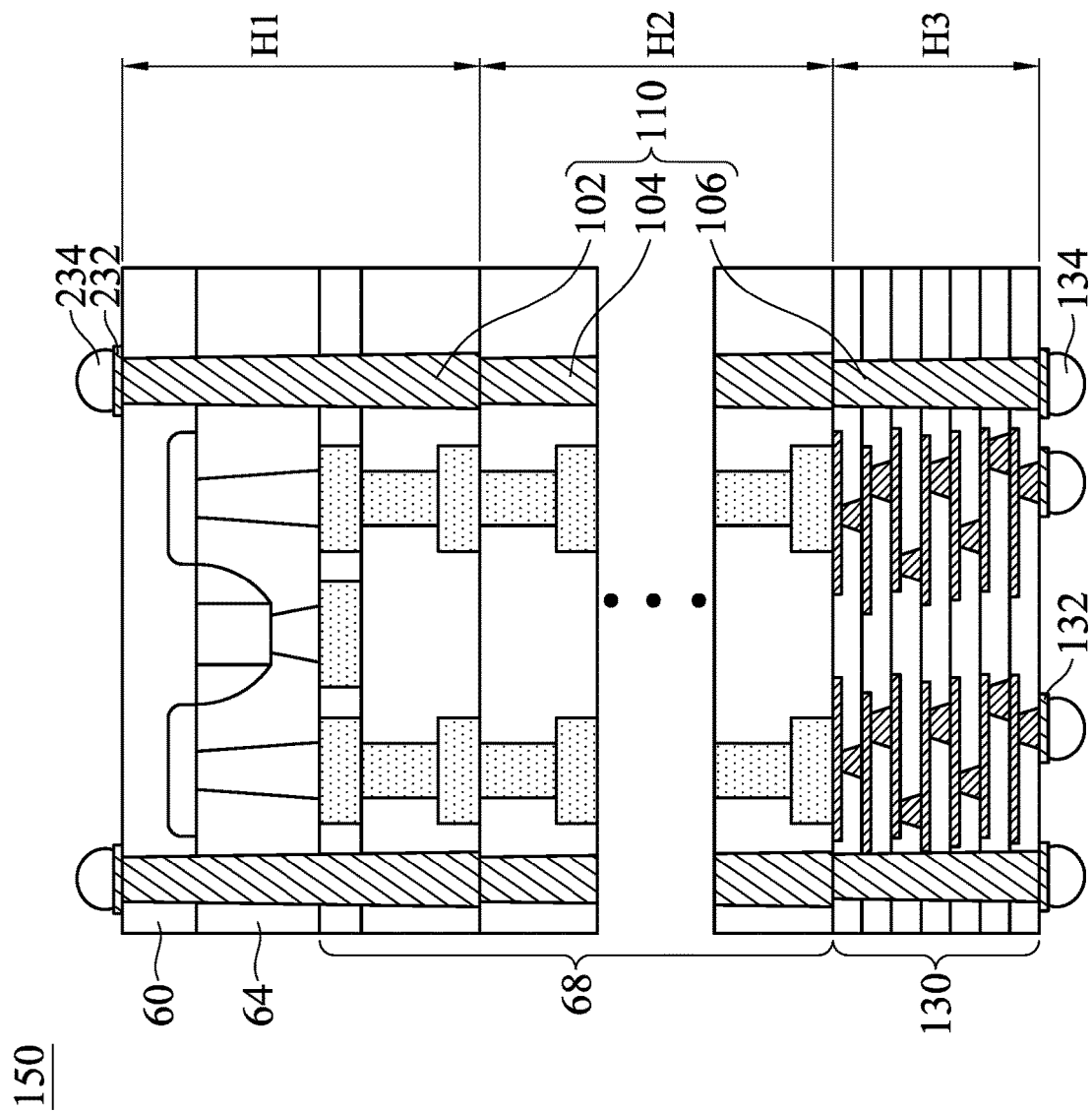
FIG. 10 is a cross-sectional view of a semiconductor die, in accordance with some embodiments.

FIG. 10 illustrates a semiconductor die 150 singulated from the semiconductor structure 50 as illustrated above in FIG. 9. The semiconductor die 150 comprises a semiconductor substrate 60, an ILD layer 64, an interconnect structure 68, and a redistribution structure 130. In some embodiments, through vias 102 extend through the semiconductor substrate 60, the ILD layer 64, and extend into the interconnect structure 68, through vias 104 extend from respective surfaces of the through vias 102 to an interface between the interconnect structure 68 and the redistribution structure 130, and through vias 106 extend from respective surfaces of the through vias 104 through the redistribution structure 130. As such, each group of through vias 102, 104, and 106 connected end-to-end form a multi-through via 110 extending through the semiconductor die 150. However, the multi-through vias 110 may comprise any suitable number of through vias, such as two to five through vias, wherein each through via pass through a plurality of metallization layers (e.g., M1, M2, MX) and/or a plurality of redistribution layers (e.g., redistribution layer 128) the through vias may each pass through any suitable numbers of metallization layers and/or dielectric layers.

As an example, a multi-through via 110 could include: a first through via extending through the semiconductor substrate 60, the ILD layer 64, and three to five metallization layers of the interconnect structure 68; and a second through via extending through the remaining metallization layers of the interconnect structure 68 and the redistribution structure 130. As another example, a multi-through via 110 could include: a first through via extending through the semiconductor substrate 60 and the ILD layer 64; a second through via extending through two to five metallization layers of the interconnect structure 68; a third through via extending through an additional two to five metallization layers of the interconnect structure 68; a fourth through via extending through the remaining metallization layers of the interconnect structure 68 and through two to four dielectric layers of the redistribution structure 130; and a fifth through via extending through the remaining dielectric layers of the redistribution structure 130.

The multi-through vias 110 may be used for electrical connections through the semiconductor die 150 in larger structures such as e.g. 3D packages or 3D integrated circuits (3DICs). By using multi-through vias 110 comprising shorter through vias connected end-to-end, the width of the through vias may be reduced due to the shorter through vias having improved filling processes. This may be advantageous by providing additional space for active devices, passive devices, and other circuitry in the semiconductor die 150.

Embodiments may provide advantages. Multiple through vias are formed through a semiconductor die or wafer in order to allow for stacking of multiple dies to form 3D packages or 3D integrated circuits (3DICs). The aspect ratios of each through via may be reduced by using multiple through vias formed along the same line. Due to these reduced aspect ratios, the filling of through vias is improved, allowing through vias smaller widths to be used. This may provide more space for structures such as active and passive devices and conductive lines and vias in interconnect and redistribution layers.

In accordance with an embodiment, a semiconductor structure includes: a semiconductor substrate, the semiconductor substrate having a first side and a second side opposite the first side; an active device on the first side of the semiconductor substrate; an interconnect structure on the semiconductor structure, the interconnect structure being over the active device, the interconnect structure including a first metallization layer, a second metallization layer over the first metallization layer, a third metallization layer over the second metallization layer, and a fourth metallization layer over the third metallization layer; a first through via extending through the semiconductor substrate, the first through via extending through the first metallization layer and the second metallization layer; and a second through via in the interconnect structure, the second through via extending through the third metallization layer and the fourth metallization layer, a bottom surface of the second through via contacting a top surface of the first through via. In some embodiments, the semiconductor structure further includes a third through via in the interconnect structure, wherein the second through via is interposed between the first through via and the third through via. In some embodiments of the semiconductor structure, the second through via physically contacts the third through via. In some embodiments, the semiconductor structure further includes a first conductive connector on the second side of the semiconductor substrate and a second conductive connector on the interconnect structure, the first conductive connector being electrically coupled to the second conductive connector through the first through via, the second through via, and the third through via. In some embodiments of the semiconductor structure, the second through via has a single continuous barrier layer extending from a top surface of the second through via to a bottom surface of the second through via. In some embodiments, the semiconductor structure further includes a third metallization layer between the first metallization layer and the second metallization layer, the first through via extending through the third metallization layer. In some embodiments of the semiconductor structure, an upper surface of the first through via has a first width in a range of 0.2 μm to 3 μm. In some embodiments of the semiconductor structure, a lower surface of the first through via has a second width in a range of 0.1 μm to 2.5 μm.

In accordance with another embodiment, a semiconductor structure includes: a transistor on a substrate; a first dielectric layer over the transistor; a first metallization layer over the first dielectric layer; a second metallization layer over the first metallization layer; a first through via extending through the second metallization layer, the first metallization layer, the first dielectric layer, and the substrate; a third metallization layer over the second metallization layer; a fourth metallization layer over the third metallization layer; a second through via extending through the fourth metallization layer and the third metallization layer, a bottom surface of the second through via contacting a top surface of the first through via; a redistribution structure over the fourth metallization layer, the redistribution structure including a first redistribution layer and a second redistribution layer; and a third through via extending through the first redistribution layer and the second redistribution layer, a bottom surface of the third through via contacting a top surface of the second through via. In some embodiments, the semiconductor structure further includes a first external connector on a top surface of the third through via. In some embodiments, the semiconductor structure further includes a second external connector on a bottom surface of the first through via, the second external connector being electrically coupled to the first external connector. In some embodiments of the semiconductor structure, a keep-out zone surrounding the third through via is free of other conductive features, the keep-out zone extending to a distance from outer sidewalls of the third through-via in a range of 0.2 μm to 5 μm. In some embodiments of the semiconductor structure, the first through via, the second through via, and the third through via have a width in a range of 0.2 μm to 3 μm.

In accordance with yet another embodiment, a method of forming a semiconductor structure includes: forming a first portion of an interconnect structure over a substrate, the substrate including an active device, the first portion of the interconnect structure including a first dielectric layer over the active device, a first metallization layer over the first dielectric layer, and a second metallization layer over the first metallization layer; forming a first through via through the first portion of the interconnect structure and into the substrate; forming a second portion of the interconnect structure over the first portion of the interconnect structure, the second portion of the interconnect structure including a third metallization layer over the second metallization layer and a fourth metallization layer over the third metallization layer; and forming a second through via through the second portion of the interconnect structure, the second through via contacting the first through via. In some embodiments, the method further includes: forming a redistribution structure over the second portion of the interconnect structure, the redistribution structure including a first redistribution layer over the fourth metallization layer and a second redistribution layer over the first redistribution layer; and forming a third through via through the first redistribution layer and the second redistribution layer, the third through via overlying the second through via. In some embodiments, the method further includes: forming a third portion of the interconnect structure over the second portion of the interconnect structure, the third portion of the interconnect structure including a fifth metallization layer over the fourth metallization layer and a sixth metallization layer over the fifth metallization layer; and forming a fourth through via through the third portion of the interconnect structure, the fourth through via contacting the second through via, the third through via contacting the fourth through via. In some embodiments, the method further includes forming a first conductive connector on the third through via. In some embodiments, the method further includes forming a second conductive connector on the first through via, wherein the first conductive connector is electrically coupled to the second conductive connector. In some embodiments of the method, the first through via and the second through via have a width in a range of 0.2 μm to 3 μm. In some embodiments of the method, a keep-out one surrounding the first through via, the second through via, and the third through via in a top view is free of other conductive features, the keep-out zone extending to a distance from outer sidewalls of the first through-via in a range of 0.2 μm to 5 μm.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor structure, the method comprising:
   forming a first portion of an interconnect structure over a substrate, the first portion of the interconnect structure comprising a first metallization layer over the substrate, and a second metallization layer over the first metallization layer;
   forming a first through via through the first portion of the interconnect structure;
   forming a second portion of the interconnect structure over the first portion of the interconnect structure, the second portion of the interconnect structure comprising a third metallization layer over the second metallization layer and a fourth metallization layer over the third metallization layer;

forming a second through via through the second portion of the interconnect structure, the second through via contacting the first through via;

thinning the substrate to expose the first through via; and forming an external contact on the first through via.

2. The method of claim 1, further comprising:

forming a redistribution structure over the second portion of the interconnect structure, the redistribution structure comprising a first redistribution layer over the fourth metallization layer and a second redistribution layer over the first redistribution layer; and forming a third through via through the first redistribution layer and the second redistribution layer, the third through via overlying and electrically coupled to the second through via.

3. The method of claim 2, wherein a width of the third through via at an upper surface of the third through via is in a range between 0.2 μm to 3 μm, and wherein a width of the third through via at a lower surface of the third through via is in a range between 0.1 μm to 2.5 μm.

4. The method of claim 2, further comprising:

forming a third portion of the interconnect structure over the second portion of the interconnect structure, the third portion of the interconnect structure comprising a fifth metallization layer over the fourth metallization layer and a sixth metallization layer over the fifth metallization layer; and forming a fourth through via through the third portion of the interconnect structure, the fourth through via contacting the second through via, the third through via contacting the fourth through via.

5. The method of claim 2, further comprising forming a first conductive connector on the third through via.

6. The method of claim 5, further comprising forming a second conductive connector on the first through via, wherein the first conductive connector is electrically coupled to the second conductive connector.

7. The method of claim 1, wherein the first through via and the second through via have a width in a range of 0.2 μm to 3 μm.

8. The method of claim 1, wherein a keep-out zone surrounding the first through via, the second through via, and the third through via in a top view is free of other conductive features, the keep-out zone extending to a distance from outer sidewalls of the first through via in a range of 0.2 μm to 5 μm.

9. The method of claim 1, wherein the second through via includes a second fill material that is in direct contact with a first fill material of the first through via.

10. A method of forming a semiconductor structure, the method comprising:

forming a transistor on a substrate;

forming a first dielectric layer over the transistor and the substrate;

forming a first conductive via extending through the first dielectric layer and into the substrate;

forming one or more a first metallization layers over the first dielectric layer;

forming a second conductive via extending through the one or more a first metallization layers, the second conductive via being electrically coupled to the first conductive via;

forming a redistribution structure over the one or more first metallization layers, the redistribution structure comprising a first redistribution layer and a second redistribution layer;

forming a third conductive via extending through the first redistribution layer and the second redistribution layer, a bottom surface of the third through via contacting a top surface of the second through via; and thinning the substrate to expose the first conductive via.

11. The method of claim 10, further comprising:

forming one or more second metallization layers over the one or more first metallization layers; and forming a fourth conductive via extending through the one or more second metallization layers, wherein a bottom surface of the fourth through via contacts a top surface of the first conductive via, wherein a bottom surface of the second conductive via contacts a top surface of the fourth conductive via.

12. The method of claim 10, further comprising forming a first external connector on the exposed surface of the first conductive via.

13. The method of claim 12, further comprising forming a second external connector on the third conductive via.

14. The method of claim 10, wherein the first conductive via, the second conductive via, and the third conductive via have a width in a range of 0.2 μm to 3 μm.

15. The method of claim 10, wherein a keep-out zone surrounding the third conductive via is free of other conductive features, the keep-out zone extending to a distance from outer sidewalls of the third conductive via in a range of 0.2 μm to 5 μm.

16. The method of claim 10, wherein the second conductive via includes a second fill material having a base surface that is in direct contact with an upper surface of a first fill material of the first conductive via.

17. A semiconductor structure, comprising:

a semiconductor substrate, the semiconductor substrate having a first side and a second side opposite the first side;

an active device on the first side of the semiconductor substrate;

an interconnect structure on the semiconductor substrate, the interconnect structure being over the active device, the interconnect structure comprising a plurality of metallization layers;

a first through via extending through at least one metallization layer of the plurality of metallization layers and into the semiconductor substrate, the first through via including a first fill material; and a second through via in the interconnect structure, the second through via including a second fill material extending through two or more metallization layers of the plurality of metallization layers, a bottom surface of the second fill material directly contacting a top surface of the first fill material of the first through via.

18. The semiconductor structure of claim 17, wherein an upper surface of the first through via has a first width in a range of 0.2 μm to 3 μm.

19. The semiconductor structure of claim 18, wherein a lower surface of the first through via has a second width in a range of 0.1 μm to 2.5 μm.

20. The semiconductor structure of claim 17, wherein a keep-out zone surrounding the third through via is free of other conductive features, the keep-out zone extending to a distance from outer sidewalls of the third through via in a range of 0.2 μm to 5 μm.

* * * * *